(12) United States Patent
Li

(10) Patent No.: US 7,616,069 B2
(45) Date of Patent: Nov. 10, 2009

(54) METHOD AND SYSTEM FOR FAST PLL CLOSE-LOOP SETTLING AFTER OPEN-LOOP VCO CALIBRATION

(75) Inventor: Dandan Li, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 18 days.

(21) Appl. No.: 11/618,715

(22) Filed: Dec. 29, 2006

(65) Prior Publication Data

US 2008/0136533 A1    Jun. 12, 2008

Related U.S. Application Data

(60) Provisional application No. 60/868,818, filed on Dec. 6, 2006.

(51) Int. Cl.
*H03L 7/085*    (2006.01)

(52) U.S. Cl. ............... 331/25; 331/17; 331/16; 327/157

(58) Field of Classification Search ............ 331/14, 331/16, 17, 25, 1 A, 44, 179; 327/156, 157
See application file for complete search history.

(56) References Cited

U.S. PATENT DOCUMENTS

| | | | | |
|---|---|---|---|---|
| 5,038,117 | A * | 8/1991 | Miller | 331/16 |
| 5,151,665 | A * | 9/1992 | Wentzler | 331/8 |
| 6,327,319 | B1 * | 12/2001 | Hietala et al. | 375/374 |
| 2005/0258907 | A1 * | 11/2005 | Zachan et al. | 331/16 |
| 2005/0264330 | A1 * | 12/2005 | Li | 327/156 |

OTHER PUBLICATIONS

Q. Huang and R. Rogenmoser, "Speed Optimization of Edge-Triggered CMOS CircuitsFor Gigahertz Single-Phase Clock," IEEE JSSC, vol. 31, No. 3, pp. 456-464, Mar. 1996.

H. Huh, Y. Koo, K. Lee, Y. Ok, S. Lee D. Kwon, J. Lee, Joonbae Park, D. Lee, D. Jeong and W. Kim, "Comparison Frequency Doubling and Charge Pump Matching Techniques for Dual-Band Fractional-N Frequency Synthesizer," IEEE JSSC, vol. 40, No. 11, pp. 2228-2236, Nov. 2005.

S. Pellerano, S. Levantino, C. Samori, and L. Lacaita, "A 13.5-mW 5 GHz Frequency Synthesizer With Dynamic-Logic Frequency Divider," IEEE JSSC, vol. 39, No. 2, pp. 378-383, Feb. 2004.

J. Yuan and C. Svensson, "High-Speed CMOS Circuit Technique," IEEE JSSC. vol. 24, No. 1, pp. 62-70, Feb. 1989.

M. Kozak and E. Friedman, "Design and Simulation of Fractional-N PLL Frequency Synethesizers," IEEE ISCAS, pp. 780-783, May 2004.

* cited by examiner

*Primary Examiner*—Robert Pascal
*Assistant Examiner*—Ryan J. Johnson
(74) *Attorney, Agent, or Firm*—McAndrews Held & Malloy, Ltd.

(57) ABSTRACT

Aspects of a method and system for a fast phase-locked loop (PLL) close-loop settling after an open-loop voltage controlled oscillator (VCO) calibration are provided. A fractional-N PLL synthesizer may comprise a VCO, a phase-frequency detector (PFD), a D flip-flop, a divider, a charge pump, and a loop filter. The synthesizer may disable the PFD based on a control signal indicating the start of VCO open-loop calibration. After open-loop calibration, the synthesizer may subsequently enable a PLL closed-loop settling and may enable the PFD to control the charge pump when the input reference signal phase lags a phase of a divider signal generated by the divider. The D flip-flop may enable and disable the PFD. During open-loop calibration, the loop filter may be discharged via a leakage current in the charge pump. During closed-loop settling, the loop filter may be charged by the charge pump via control of the PFD.

20 Claims, 8 Drawing Sheets

METHOD AND SYSTEM FOR FAST PLL CLOSE-LOOP SETTLING AFTER OPEN-LOOP VCO CALIBRATION

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818 filed on Dec. 6, 2006.

This application also makes reference to:
U.S. application Ser. No. 11/618,655 filed on even date herewith;
U.S. application Ser. No. 11/618,651 filed on even date herewith; and
U.S. application Ser. No. 11/618,118 filed on even date herewith.

Each of the above stated applications is hereby incorporated by reference in its entirety.

FIELD OF THE INVENTION

Certain embodiments of the invention relate to signal processing. More specifically, certain embodiments of the invention relate to a method and system for a fast phase-locked loop (PLL) close-loop settling after an open-loop voltage control oscillator (VCO) calibration.

BACKGROUND OF THE INVENTION

Wireless Local Area Networks (WLANs) have gained significant popularity and are widely deployed because of the flexibility and convenience in connectivity that they provide. WLANs enable connections to devices that are located within somewhat large geographical areas, such as the area covered by a building or a campus, for example. WLAN systems are based on IEEE 802.11 standard specifications, which typically operate within a 100-meter range, and are generally utilized to supplement the communication capacity provided by traditional wired Local Area Networks (LANs) installed in the same geographic area as the WLAN systems.

The introduction of networks based on the new IEEE 802.11n standard specifications promises to at least double the theoretical wireless bandwidth of today's 54 Mbit/s data rates supported by IEEE 802.11a/g networks, for example. In fact, networks based on the proposed IEEE 802.11n specifications may be able to offer up to 10 times the capacity offered by current WLAN systems.

Because of the increases in data rates supported by forthcoming WLAN systems, more demanding specifications may be required for the design of frequency synthesizers used in wireless terminals, such as mobile devices, for example, and/or in access points (APs) to generate the reference signals used for IEEE 802.11n operation. WLAN radios may also be integrated into a cellular phone. For such embedded application, a frequency synthesizer may need to be able to operate over a wide range of reference frequencies. At the same time, loop bandwidth may have to be sufficiently high to meet settling requirements when a WLAN radio is switched between receiving and transmitting operations.

Optimizing the design of a frequency synthesizer requires that both high bandwidth and low phase noise specifications are met simultaneously, a task that may generally be difficult to achieve. In this regard, fractional-N phase-locked-loop (PLL) frequency synthesizers may be utilized in wireless terminals to try to meet simultaneous fine resolution and high bandwidth. The fractional-N PLL frequency synthesizer enables dithering a divide value between integer values in order to produce a fractional divide value that is utilized in the frequency synthesizer's feedback loop. However, the dithering operation may generally introduce quantization noise into the frequency synthesizer, negatively impacting the overall phase noise performance. Moreover, as the bandwidth in the loop increases more quantization noise appears at the output. However, a higher bandwidth may better suppress the noise contributed by a voltage controlled oscillator (VCO). When trying to achieve a given noise specification, different noise sources inside the PLL may result in conflicting requirements on loop bandwidth. In this regard, performance optimization becomes an important aspect of the frequency synthesizer design.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for a fast phase-locked loop (PLL) close-loop settling after an open-loop voltage control oscillator (VCO) calibration, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for fast phase-locked loop (PLL) close-loop settling after open-loop voltage control oscillator (VCO)

calibration. Aspects of the invention may comprise a fractional-N PLL synthesizer that comprises a phase-frequency detector (PFD), a VCO, a charge pump, a loop filter, a frequency divider and a reference generator. A control signal, which may be generated from a VCO calibration machine, for example, may enable a VCO open-loop calibration and may be used to disable the PFD. After VCO open-loop calibration finishes, the control signal may be inverted, and the PLL loop may subsequently be closed resulting in the start of a closed-loop settling process. When the control signal indicates the start of closed-loop settling, the PFD may be enabled after receiving the active edge from the reference generator, and before receiving the active edge from the frequency divider. The output of the PFD may subsequently indicate that the phase of the divider output leads the phase of reference generator output at the beginning of the closed-loop process. Enabling and disabling the PFD may be performed by a D flip-flop in the synthesizer. The PFD may control a charge pump in the synthesizer. During the open-loop calibration, a loop filter in the synthesizer may be discharged via a leakage current in the charge pump. During the closed-loop settling, the loop filter may be charged by the charge pump as controlled by the PFD.

Figure 1A:
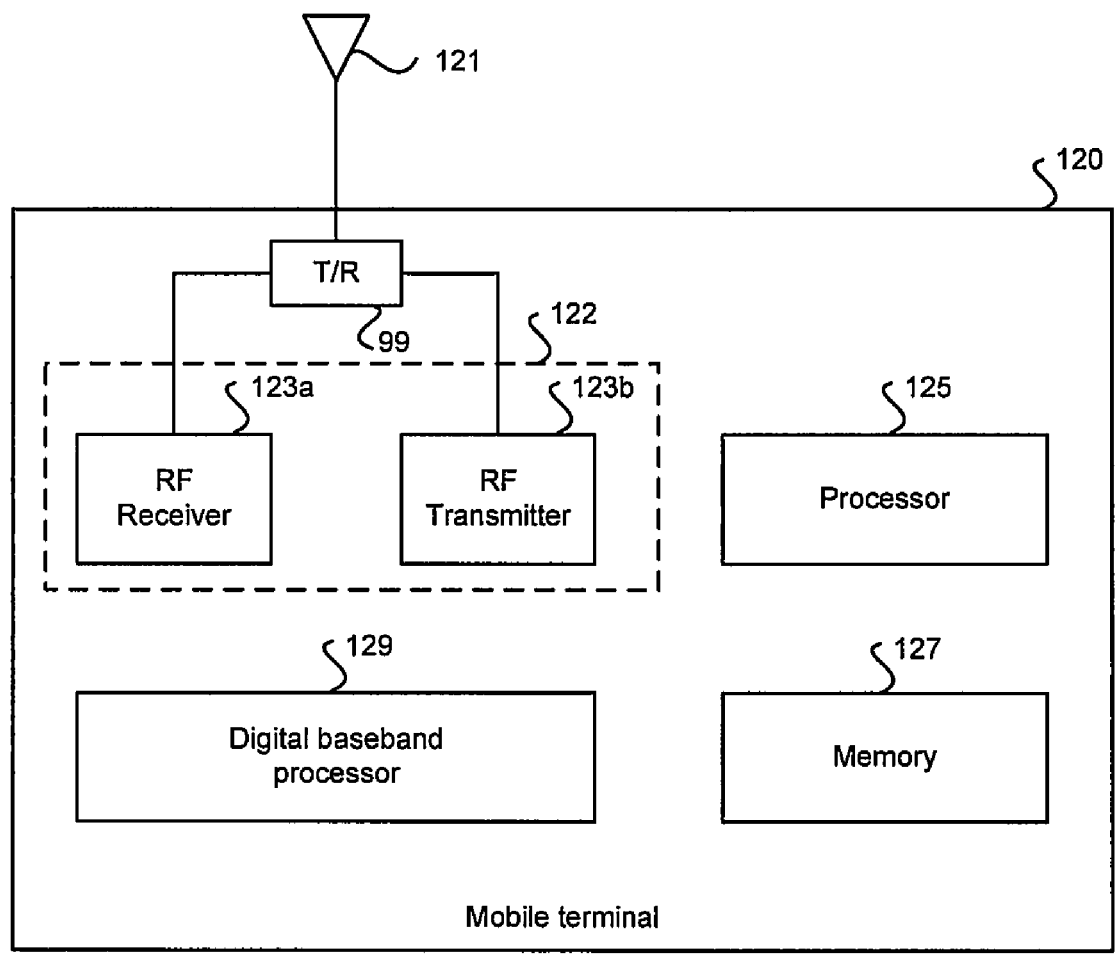
FIG. 1A is a block diagram illustrating an exemplary wireless terminal, in accordance with an embodiment of the invention.

FIG. 1A is a block diagram illustrating an exemplary wireless terminal, in accordance with an embodiment of the invention. Referring to FIG. 1A, there is shown a wireless terminal 120 that may comprise an RF receiver 123a, an RF transmitter 123b, a digital baseband processor 129, a processor 125, and a memory 127. In an embodiment of the invention, the RF receiver 123a and the RF transmitter 123b may be integrated into a single RF transceiver 122, for example. A single transmit and receive antenna 121 may be communicatively coupled to the RF receiver 123a and the RF transmitter 123b. A switch or other device having switching capabilities may be coupled between the RF receiver 123a and RF transmitter 123b, and may be utilized to switch the antenna 121 between transmit and receive functions. The wireless terminal 120 may be operated in a system, such as the Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise an RF transceiver, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise an RF transceiver, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123*a* for receiving WLAN signals in the appropriate frequency band.

Figure 1B:
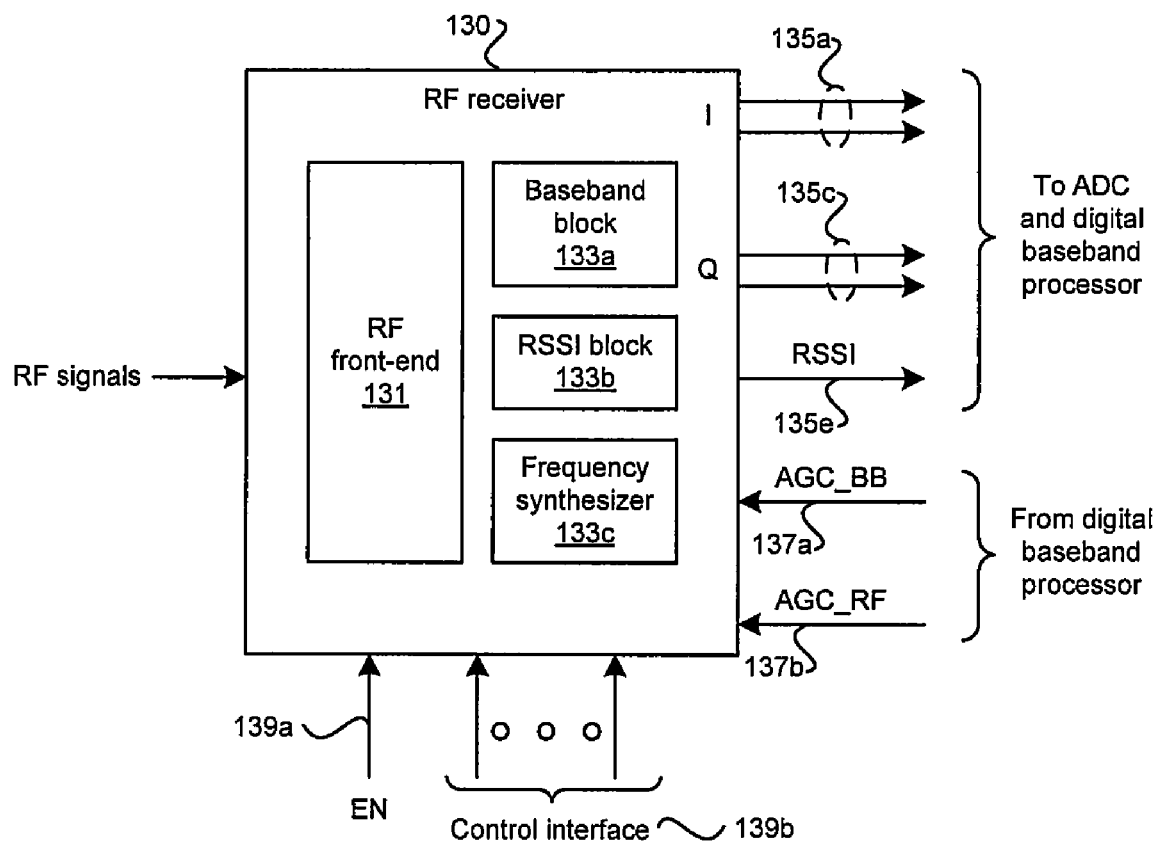
FIG. 1B is a block diagram illustrating an exemplary RF receiver in a mobile terminal, in accordance with an embodiment of the invention.

FIG. 1B is a block diagram illustrating an exemplary RF receiver in a mobile terminal, in accordance with an embodiment of the invention. Referring to FIG. 1B, there is shown an RF receiver 130 that may comprise an RF front-end 131, a baseband block 133*a*, a received signal strength indicator (RSSI) block 133*b*, and a frequency synthesizer 133*c*. The RF receiver 130 may correspond to the RF receiver 123*a* in the wireless terminal 120 disclosed in FIG. 1A, for example.

The RF receiver 130 may comprise suitable logic, circuitry, and/or code that may enable handling of a plurality of RF signals that may comprise signals in accordance with the IEEE 802.11n standard specifications for WLAN networks. The RF receiver 130 may be enabled via an enable signal, such as the signal EN 139*a*, for example. At least a portion of the circuitry within the RF receiver 130 may be controlled via the control interface 139*b*. The control interface 139*b* may receive information from, for example, a processor, such as the processor 125 and/or the digital baseband processor 129 disclosed in FIG. 1A. The control interface 139*b* may comprise more than one bit. For example, when implemented as a 2-bit interface, the control interface 139*b* may be an inter-integrated circuit (I2C) interface.

The RF front-end 131 may comprise suitable logic, circuitry, and/or code that may enable low noise amplification and direct down conversion of RF signals. In this regard, the RF front-end 131 may utilize an integrated low noise amplifier (LNA) and mixers, such as passive mixers, for example. The RF front-end 131 may communicate the resulting baseband frequency signals to the baseband block 133*a* for further processing. In an embodiment of the invention, the RF front-end 131 may enable receiving RF signals in a plurality of frequency bands that may comprise the frequency band utilized for WLAN communications. In this regard, the RF front-end 131 may be implemented by utilizing separate RF front-end blocks for each of the frequency bands supported, for example.

The frequency synthesizer 133*c* may comprise suitable logic, circuitry, and/or code that may enable generating the appropriate local oscillator (LO) signal or reference signal for performing down conversion in the RF front-end 131. Since the frequency synthesizer 133*c* may enable fractional multiplication of a source frequency when generating the LO signal, a large range of crystal oscillators may be utilized as a frequency source for the frequency synthesizer 133*c*. This approach may enable the use of an existing crystal oscillator in a mobile terminal PCB, thus reducing the number of external components necessary to support the operations of the RF receiver 130, for example. In some instances, the frequency synthesizer 133*c* may have at least one integrated voltage controlled oscillator (VCO) for generating the LO signal. For example, the frequency synthesizer 133*c* may be implemented based on fractional-N phase-locked-loop (PLL) synthesizer design to enable high bandwidth and to achieve low phase noise specifications. In this regard, the design of the frequency synthesizer 133*c* may be required to support higher data rates, such as the data rates specified in the IEEE 802.11n standard for WLAN networks, for example.

The baseband block 133*a* may comprise suitable logic, circuitry, and/or code that may enable processing of I/Q components generated from the down conversion operations in the RF front-end 131. The baseband block 133*a* may enable amplification and/or filtering of the I/Q components in analog form. The baseband block 133*a* may also enable communication of the processed I component, that is, signal 135*a*, and of the processed Q component, that is, signal 135*c*, to an analog-to-digital converter (ADC) for digital conversion before being communicated to the digital baseband processor 129, for example.

The RSSI block 133*b* may comprise suitable logic, circuitry, and/or code that may enable measuring the strength, that is, the RSSI value, of a received RF signal. The RSSI block 133*b* may be implemented based on a logarithmic amplifier, for example. The RSSI measurement may be performed, for example, after the received RF signal is amplified in the RF front-end 131. The RSSI block 133*b* may enable communication of the analog RSSI measurement, that is, signal 135*e*, to an ADC for digital conversion before being communicated to the digital baseband processor 129, for example.

The RF receiver 130 may enable receiving at least one signal, such as the signals AGC_BB 137*a* and AGC_RF 137*b*, from the digital baseband processor 129 for adjusting operations of the RF receiver 130. For example, the signal AGC_BB 137*a* may be utilized to adjust the gain provided by the baseband block 133*a* on the baseband frequency signals generated from the RF front-end 131. In another example, the signal AGC_RF 137*b* may be utilized to adjust the gain provided by an integrated LNA in the RF front-end 131. In this regard, the signal AGC_RF 137*b* may be utilized to adjust the gain during a calibration mode, for example. In another example, the RF receiver 130 may enable receiving from the digital baseband processor 129 at least one control signal or control information via the control interface 139*b* for adjusting operations within the RF receiver 130.

Notwithstanding that the frequency synthesizer 133*c* has been shown as comprised within the RF receiver 130, aspects of the invention need not be so limited. In this regard, a frequency synthesizer integrated within an RF receiver may also be utilized with an RF transmitter, such as the RF transmitter 123*b* disclosed in FIG. 1A, for example. In some instances, a frequency synthesizer may be integrated within the RF transmitter and may be utilized by the RF receiver. In other instances, the frequency synthesizer may be implemented separate from the RF transmitter or the RF receiver, for example. Moreover, when a single RF transceiver is utilized with the wireless terminal 120, the frequency synthesizer may be integrated within the single RF transceiver.

Figure 1C:
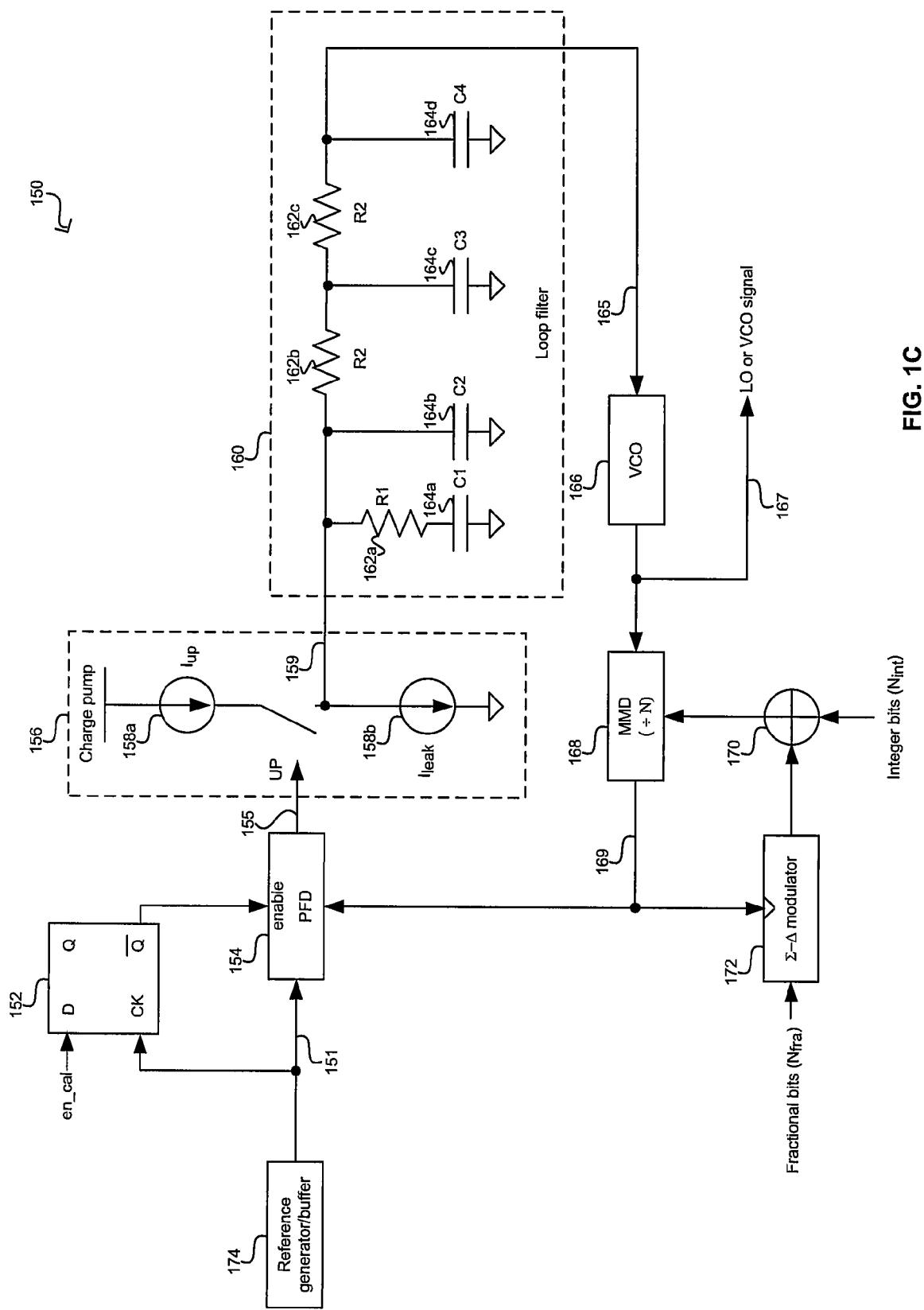
FIG. 1C is a block diagram illustrating an exemplary fractional-N phase-locked-loop (PLL) synthesizer for use in a wireless terminal, in accordance with an embodiment of the invention.

FIG. 1C is a block diagram illustrating an exemplary fractional-N phase-locked-loop (PLL) synthesizer for use in a wireless terminal, in accordance with an embodiment of the invention. Referring to FIG. 1C, there is shown a fractional-N PLL synthesizer 150 that may comprise a D flip-flop 152, a phase-frequency detector (PFD) 154, a charge pump 156, a loop filter 160, a voltage controlled oscillator (VCO) 166, a multi-modulus divider (MMD) 168, an adder 170, a Σ-Δ modulator 172, and a reference generator/buffer 174. The fractional-N PLL synthesizer 150 may correspond to the frequency synthesizer 133*c* disclosed in FIG. 1B. In this regard, the fractional-N PLL synthesizer 150 may be implemented on a chip and may be integrated with other components of the RF receiver 130, for example.

In one embodiment of the invention, the reference generator/buffer 174 may be communicatively coupled to an off-chip crystal (Xtal) and may operate as a crystal oscillator. The fractional-N PLL synthesizer 150 may be designed for operation with a plurality of crystal frequencies in order to generate the local oscillator (LO) or output reference signal that corresponds to a specified wireless communication protocol operation. In this regard, the fractional-N PLL synthesizer 150 may enable generation of an appropriate output reference signal from the Xtal oscillator for operating in accordance with WLAN system requirements. When the crystal frequency is low, a narrower loop bandwidth may be selected for the fractional-N PLL synthesizer 150 to at least partially reduce out-of-band quantization noise. When crystal frequency is high, a wider loop bandwidth may be selected to at least partially suppress in-band noise produced by the VCO 166.

In another embodiment of the invention, the fractional-N PLL synthesizer 150 may receive an input reference signal from another portion of the RF receiver 130 or from a portion or component from the wireless terminal 120 disclosed in FIG. 1A. The signal may be buffered by the reference generator/buffer 174. In this regard, the fractional-N PLL synthesizer 150 may generate the LO or output reference signal that corresponds to a specified wireless communication protocol operation from the received input reference signal.

The reference generator/buffer 174 may comprise suitable logic, circuitry, and/or code that may enable buffering a received input reference signal. The reference generator/buffer 174 may also enable operation as a crystal oscillator when communicatively coupled to an off-chip crystal. The original frequency of the signal buffered by the reference generator/buffer 174 or the signal generated by the reference generator/buffer 174 operating as a crystal oscillator may be increased by circuitry within the reference generator/buffer 174 that operates as a frequency doubler by generating pulses at both the rising and falling edges of the original reference signal. By doubling the frequency of the signal from the reference generator/buffer 174 to the PFD 154, the PFD 154 may also have to double the phase comparison rate.

The PFD 154 may comprise suitable logic, circuitry, and/or code that may enable controlling the charge pump 156. The PFD 154 may receive an input reference signal, such as the signal 151 from the reference generator/buffer 174, and a divider signal 169 from the MMD 168 in order to generate an UP signal 155 to control the operation of the charge pump 156. The PFD 154 may be enabled by the D flip-flop 152 for general operations and/or during a closed-loop portion of a calibration operation that may be performed on the VCO 166. When the reference generator/buffer 174 utilizes the frequency doubling operation, the PFD 154 may compare the phase at both the rising and falling edges of the original reference signal or original reference clock. This approach may enable improvements to in-band phase noise, by enabling a lower divider ratio, for example, and also to out-of-band noise, by enabling pushing out quantization noise, for example. The improvement may be greater in instances when the reference signal frequency is low.

The charge pump 156 may comprise suitable logic, circuitry, and/or code the may enable generating an output signal 159 that may be utilized for controlling the operation of the VCO 166. The charge pump 156 may comprise a charge up portion 158a and a charge down portion 158b. The UP signal 155 generated by the PFD 154 may be utilized to enable charging up the output signal 159. The charge up portion 158a may correspond to a one side current (Iup), which may be directed by UP signal 155 to charge up the voltage that corresponds to the output signal 159. The charge up portion 158a may be programmable by, for example, the processor 125 and/or the digital baseband processor 129 disclosed in FIG. 1A in accordance with crystal and VCO frequencies to optimize loop characteristics. The charge down portion 158b may correspond to a constant leakage current that creates a phase offset and enables charging down a voltage that corresponds to the output signal 159. As a result, when the fractional-N PLL synthesizer 150 locks in, the phase error may be away from the zero crossing point, which may lead to a better charge pump linearity. A more linear charge pump may reduce quantization noise folding and lower close-in fractional spur, for example. The charge down portion 158b may be programmable by, for example, the processor 125 and/or the digital baseband processor 129 disclosed in FIG. 1A, in accordance with the charge up portion 158a.

The loop filter 160 may comprise suitable logic, circuitry, and/or code that may enable filtering the output signal 159 generated by the charge pump 156 to produce a filtered signal 165 that may be utilized for controlling the operation of the VCO 166. In one embodiment of the invention, the loop filter 160 may comprise resistors R1 162a, R2 162b, and R3 162c, and capacitors C1 164a, C2 164b, C3 164c, and C4 164d. The components of the loop filter 160 may be programmable by, for example, the processor 125 and/or the digital baseband processor 129 disclosed in FIG. 1A, in accordance with crystal and VCO frequencies to optimize loop characteristics. Notwithstanding the exemplary embodiment disclosed in FIG.1 C, other loop filter designs may be utilized for the loop filter 160.

The VCO 166 may comprise suitable logic, circuitry, and/or code that may enable generation of a local oscillator or output reference signal 167 based on the filtered signal 165 that results by filtering in the loop filter 160 the output signal 159 generated by the charge pump 156. The VCO 166 may utilize a programmable conversion factor ($K_{VCO}$) for determining the output reference signal frequency in accordance with the voltage level of the filtered signal 165. In this regard, the $K_{VCO}$ may be programmable in accordance with the frequency of the VCO 166.

The MMD 168 may comprise suitable logic, circuitry, and/or code that may enable dividing the frequency of the output reference signal 167 generated by the VCO 166 to generate the divider signal 169. The MMD 168 may receive an integer divider number from the addition performed by the adder 170 of the integer bits (Nint) and the output of the $\Sigma$-$\Delta$ modulator 172. In this regard, the fractional divider ratio N is generated by dithering between a plurality of integer values in accordance with the output of the $\Sigma$-$\Delta$ modulator 172. The MMD 168 may utilize true single phase clock (TSPC) logic in at least the high-speed portions of the design to enable the MMD 168 to run at full VCO speed to keep quantization noise from $\Sigma$-$\Delta$ modulator 172 at a minimum and to enable the charge pump 156 to have better linearity. The use of TSPC logic may also provide power savings when compared to conventional high-speed logic such as source-coupled logic (SCL) and current mode logic (CML), for example. Moreover, the MMD 168 may re-synchronize the divider signal 169 with the output reference signal 167 generated by the VCO 166. Re-synchronization may reduce phase noise generated by the MMD 168 and may also enable reduction in quantization noise folding and in close-in fractional spur.

The $\Sigma$-$\Delta$ modulator 172 may comprise suitable logic, circuitry, and/or code that may enable generating a signal to be added to integer bits (Nint) of the fractional divider ratio N based on fractional bits (Nfra) of the fractional divider ratio N. The clock that drives the $\Sigma$-$\Delta$ modulator 172 may be derived from the divider signal 169 generated by the MMD 168. In this regard, the fractional divider ratio N may be obtained from the following expression: $N=f_{VCO}/f_{REF}$, where $f_{VCO}$ is the frequency of the LO or output reference signal 167 and $f_{REF}$ is the frequency of the input reference signal 151. The integer portion of N is represented by the integer bits $N_{int}$ while the fractional portion of N represented by the fractional bits $N_{fra}$. The output of the $\Sigma$-$\Delta$ modulator 172 is a stream of integer values that when added to $N_{int}$ produce an average value that approximates the fractional divider ratio N.

Figure 2:
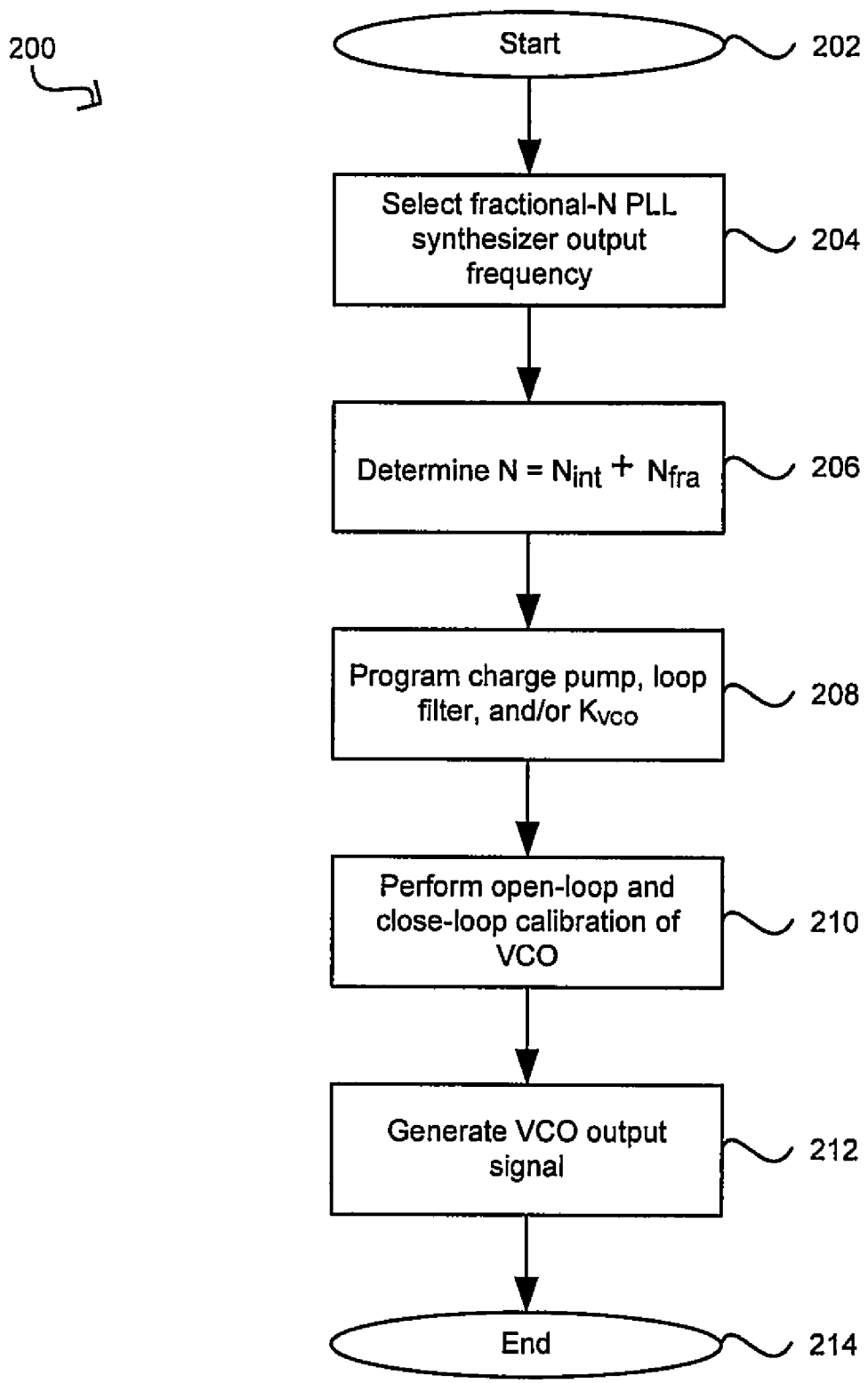
FIG. 2 is a flow diagram illustrating exemplary steps in the operation of a fractional-N PLL synthesizer, in accordance with an embodiment of the invention.

FIG. 2 is a flow diagram illustrating exemplary steps in the operation of a fractional-N PLL synthesizer, in accordance with an embodiment of the invention. Referring to FIG. 2, there is shown a flow diagram 200. In step 204, after start step 202, the output reference signal frequency, $f_{VCO}$, for the fractional-N PLL synthesizer 150 may be selected in accordance with the frequency band of the RF signals received by, for example, the RF receiver 130 disclosed in FIG. 1B. In this regard, the frequency band may depend on the wireless communication protocol being utilized.

In step 206, the fractional divider ratio N may be determined based on the output reference signal frequency, $f_{VCO}$, and the frequency of the input reference signal, $f_{REF}$. The fractional divider ratio N may have an integer portion that is represented by the integer bits $N_{int}$ that may be stored in memory, such as the memory 127 disclosed in FIG. 1A, and that may be communicated to the adder 170. The divider ratio N may also have a fractional portion that is represented by the fractional bits $N_{fra}$ that may be stored in memory and that be communicated to the $\Sigma$-$\Delta$ modulator 172. In this regard, a plurality of values for $N_{int}$ and $N_{fra}$ may be stored in memory to support a wide range of output reference signal and input reference signal frequencies. In step 208, at least a portion of the charge pump 156, the loop filter 160, and/or the VCO 166 may be programmed to optimize the loop characteristics for a particular set of operational conditions.

In step 210, a calibration or tuning of the VCO 166 may be performed. In this regard, the tuning of the VCO 166 may comprise a coarse tuning operation that may be carried out by utilizing a plurality of switching capacitors and a fine tuning operation that may be carried out by utilizing a plurality of varactors. The coarse tuning may be performed by utilizing an open-loop calibration where the loop filter 160 is disconnected from the VCO 166. The fine tuning may be performed during a closed-loop settling where the loop filter 160 is connected to the VCO 166. Long settling time that may arise in going from an open-loop calibration operation to a closed-loop operation that may be caused by replacing a large down current with a small leakage current in the charge pump 156 may be addressed by properly enabling and/or disabling the PFD 154 via the D flip-flop 152. In step 212, the fractional-N PLL synthesizer 150 may generate a LO or output reference signal from the VCO 166 in accordance with the wireless communication protocol being utilized. After step 212, the process may proceed to end step 214.

Figure 3A:
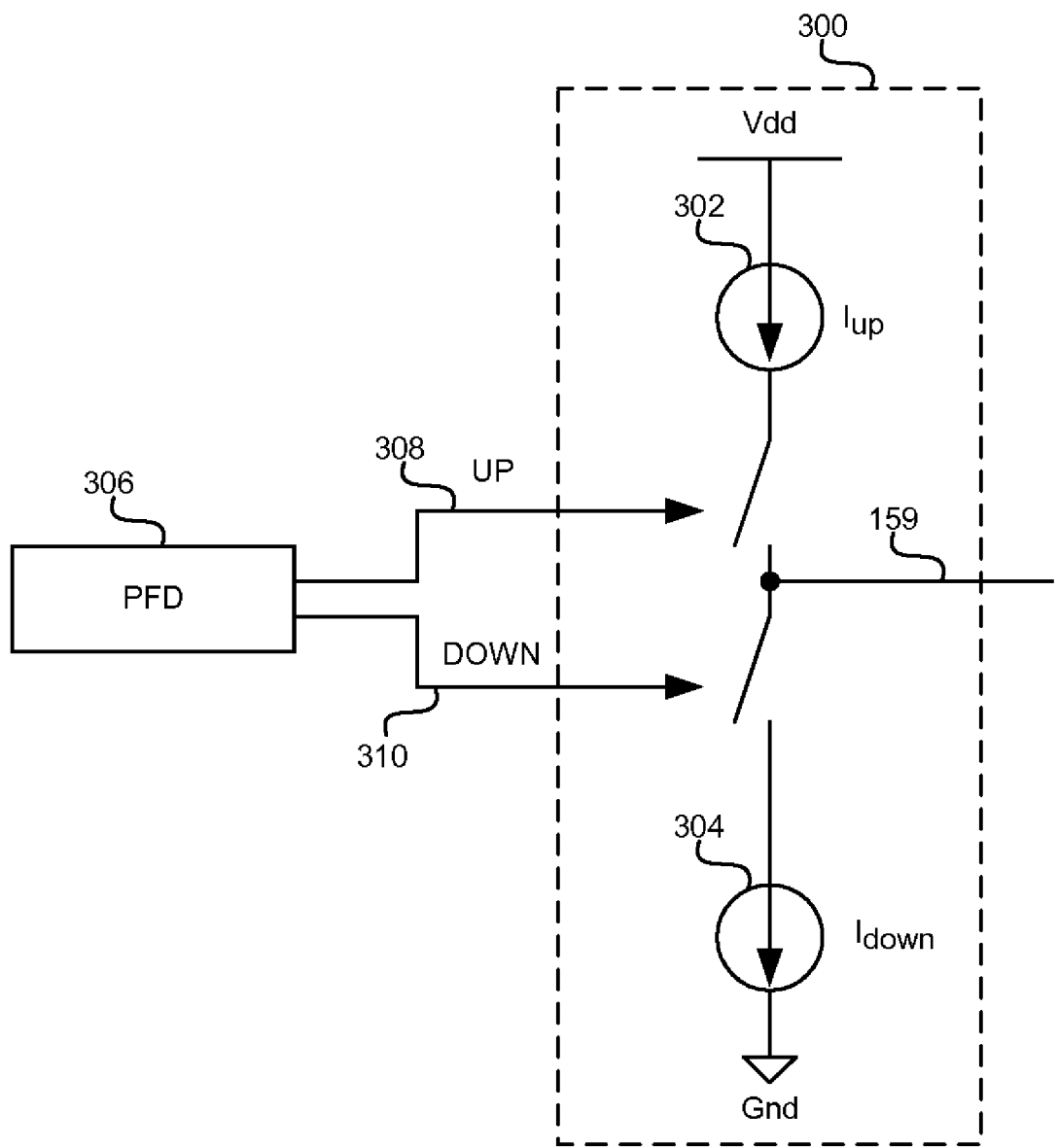
FIG. 3A is a block diagram illustrating an exemplary conventional charge pump, in connection with an embodiment of the invention.

FIG. 3A is a block diagram illustrating an exemplary conventional charge pump, in connection with an embodiment of the invention. Referring to FIG. 3A, there is shown a conventional charge pump 300 that may be utilized in a fractional-N PLL synthesizer. The conventional charge pump 300 has a charge up or up current (Iup) portion 302 and a charge down or down current (Idown) portion 304. The PFD 306 shown in FIG. 3A may differ from the PFD 154 disclosed in FIG. 1C in that it may comprise suitable logic, circuitry, and/or code that may enable generation of an UP signal 308 and a DOWN signal 310 for respectively controlling the charge up portion 302 and the charge down portion 304 of the conventional charge pump 300. Fractional-N PLL synthesizer designs may require good charge pump linearity to reduce sigma-delta quantization noise folding and close-in fractional spurs. In this regard, the conventional charge pump 300 may be significantly non-linear when phase error is around zero. In this regard, the charge pump 156 disclosed in FIG. 1C reduces non-linearity by utilizing a down current that may be a constant leakage current which introduces a phase offset to the phase-locked loop so that when a frequency lock occurs, the phase error may be away from zero and the charge pump 156 may be able to operate in its linear region.

Figure 3B:
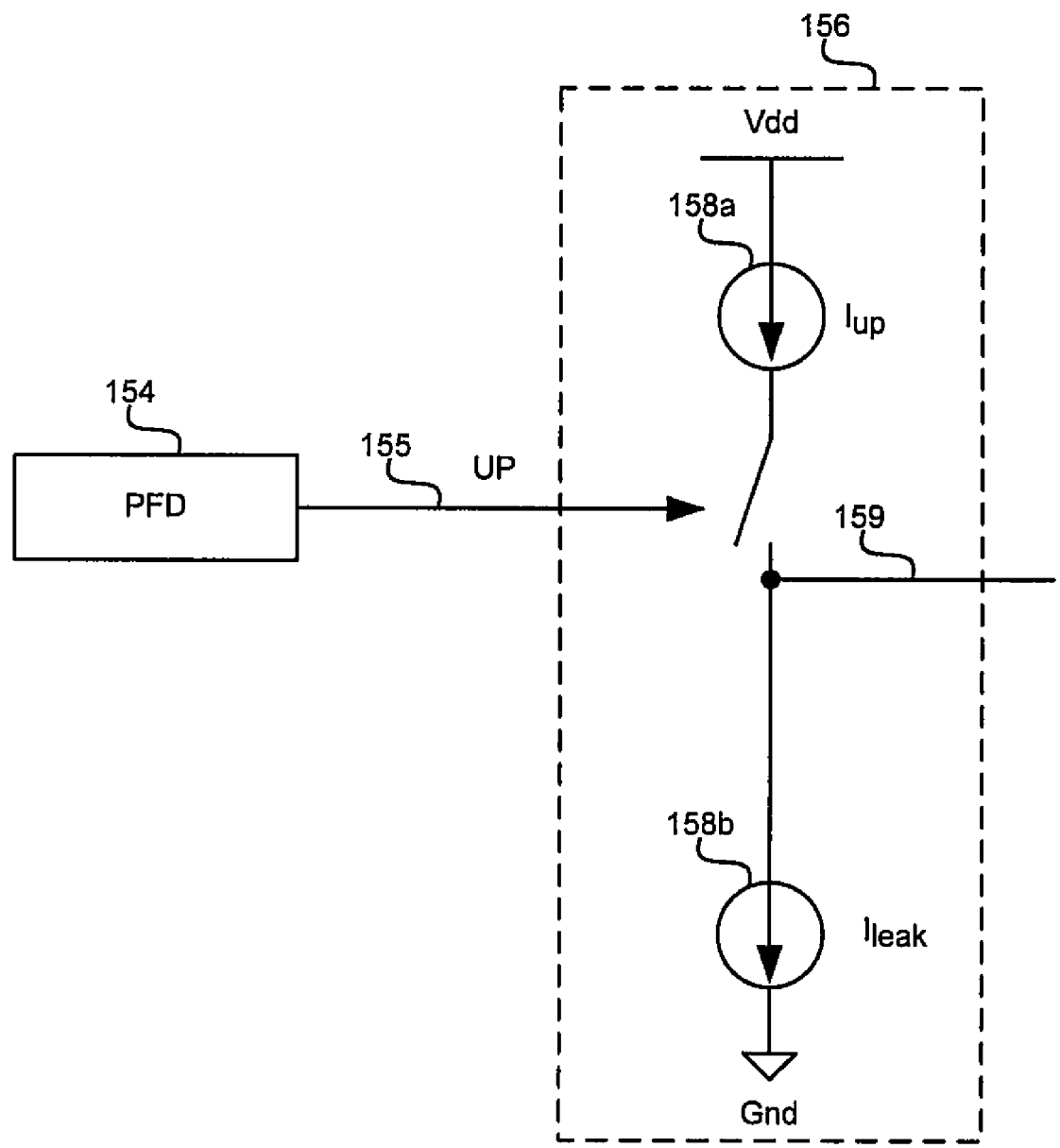
FIG. 3B is a block diagram illustrating an exemplary charge pump with a charge down leakage current, in accordance with an embodiment of the invention.

FIG. 3B is a block diagram illustrating an exemplary charge pump with a charge down leakage current, in accordance with an embodiment of the invention. Referring to FIG. 3B, there is shown the PFD 154 and the charge pump 156 disclosed in FIG. 1C. In addition to providing good linearity, in designing the charge pump 156, consideration may also be given to the need to reduce the total time utilized for calibrating the VCO 166. For example, to reduce the phase noise in the VCO 166, the value of $K_{VCO}$ may be low, around 35 MHz/V in some instances. This may lead to frequent VCO calibration when the temperature is varying. VCO calibration may be generally done in an open-loop mode to reduce calibration time and after the calibration is completed, the loop may be closed and the PLL may lock into the appropriate frequency. However, the total calibration time may be considered to be the sum of the time for the open-loop calibration operation and the settling time after the loop is closed. The close-loop settling time may need to be kept short to not have a noticeable impact on radio data throughput. Because the charge pump 156 utilizes a small charge down leakage current, Ileak, the closed-loop settling time may be too long for meeting the higher data rates needed in more advanced communication protocols.

Because Ileak is constantly on, it may have to be small to not contribute too much noise. In this regard, Ileak may be significantly smaller than Iup. For example, when Iup is 1 mA, the crystal frequency is 20 MHz, the VCO frequency is 4 GHz, and the targeted static phase offset is 4 VCO cycle, Ileak may be approximately 1 mA*20M*4/4G=20 uA. After the VCO open-loop calibration is completed and the loop is closed, if the PFD 154 first detects an input reference signal or crystal clock 151 that is leading the output of the MMD 168 with a large phase error, the voltage over the loop filter 160 may be quickly charged up close to Vdd by Iup. It may take a significant amount of time for Ileak to discharge the overshooted voltage, which may be even longer if cycle slipping occurs.

To address the closed-loop settling time issue, logic may be added to a fractional-N PLL to prevent the PFD 154 from sensing the input reference signal or crystal clock 151 first when the loop closes. In this regard, the additional logic may be utilized to generate an enable control signal that may enable or disable the PFD 154. For example, during VCO open-loop calibration, the loop filter 160 may be disconnected from the VCO 166 and the PFD 154 may be disabled based on the enable control signal so that the up current, Iup, may not charge the loop filter 160 and the leakage current, Ileak, may discharge the loop filter 160 to ground (Gnd). As a result, when VCO open-loop calibration is completed the voltage at the loop filter 160 may start from ground during the closed-loop settling. The additional logic may also be utilized to enable the PFD 154 before sensing the active edge of the divider signal 169 first.

The above described operations may be performed by introducing the D flip-flop 152 disclosed in FIG. 1C. The D flip-flop 152 may receive a control signal, such as the en_cal signal, which may be generated from a VCO calibration machine, or from the processor 125 and/or the digital baseband processor 129. The en_cal signal may be utilized to indicate that the PLL in the synthesizer is in open-loop calibration mode. In this regard, when en_cal is high, for example, the loop filter 160 may be disconnected from the VCO 166, and at next rising edge from the input reference signal 151 the PFD 154 may be disabled. When en_cal transitions low, the loop filter 160 may be connected back to the VCO 166 and the PFD 154 may be enabled at the next rising edge from the input reference signal 151. The D flip-flop 152 may be triggered on a falling edge. Whether to use a rising or a falling edge for triggering the D flip-flop 152 may be determined by whether the rising edge or the falling edge is the active edge utilized by the PFD 154 to detect a phase error. The D flip-flop 152 may be triggered at the active edge.

After the PFD 154 is enabled, it may determine whether the phase of the divider signal 169 leads or lags the phase of the input reference signal 151. When the phase of the divider signal 169 leads, the UP signal 155 generated by the PFD 154 may be a disable signal which does not turn on the up current, Iup. When the phase of the input reference signal 151 leads, the UP signal 155 may be an enable signal which turns on the up current, Iup. In this regard, the turn-on time may be proportional to the phase error. As a result of the control provided by D flip-flop 152, when the loop closes, the PFD 154 may detect that the phase from the divider signal 169 leads the phase from the input reference signal 151, and the UP signal 155 does not turn on the up current, Iup. Generally, after the loop is closed, the frequency of the VCO 160 may be lower than the expected frequency when VCO tuning voltage 165 is discharged to ground, and it may take a few cycles for the phase error to slide to zero and for the phase from the input reference signal 151 to start to lead. Because the phase error when the input reference signal 151 leads starts from a small amount and subsequently the up current, Iup, charges the loop filter 160 gradually, a big over-shoot may be avoided and the closed-loop settling time may be reduced.

Figure 4:
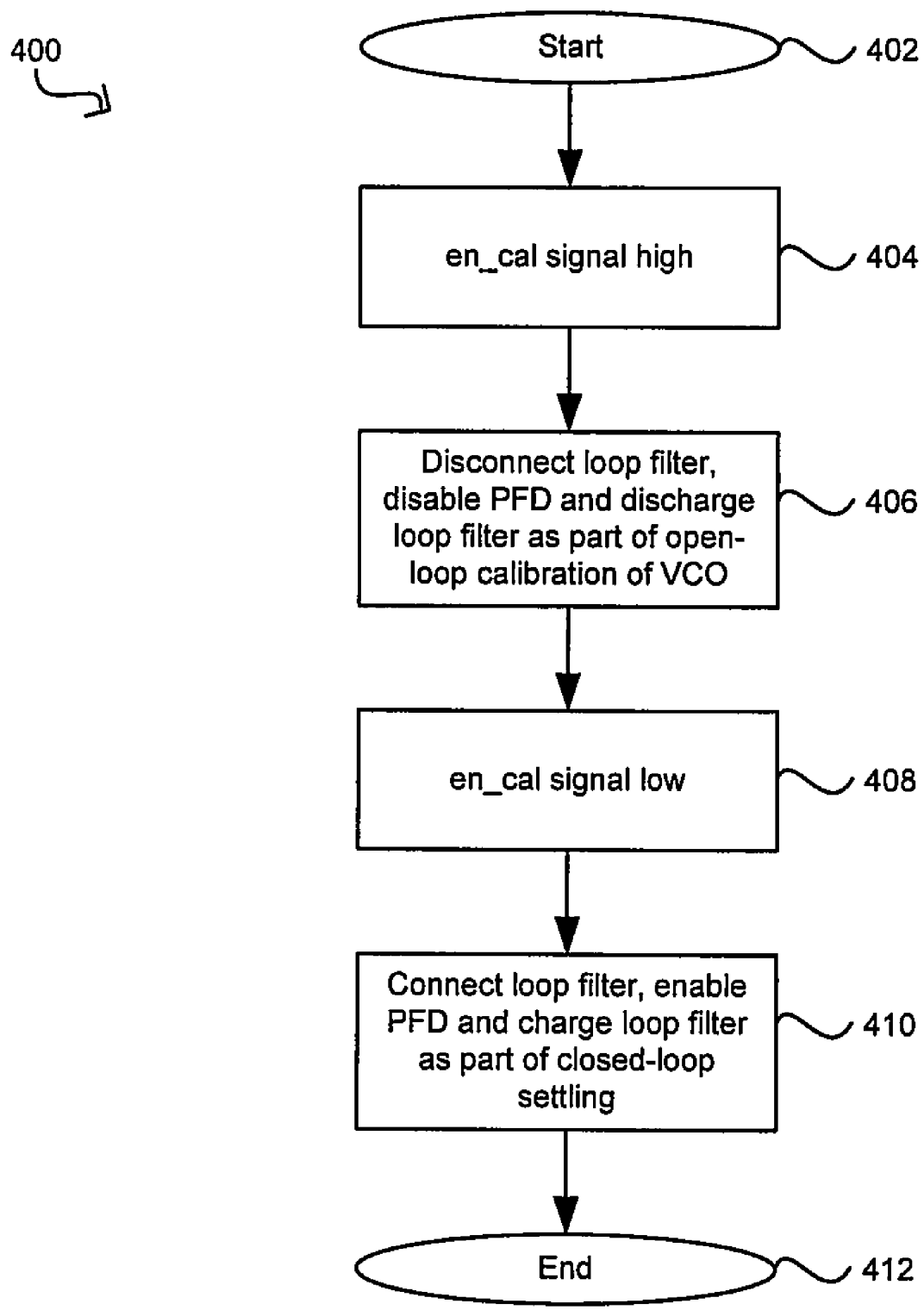
FIG. 4 is a flow diagram illustrating exemplary steps for calibration of a VCO in the fractional-N PLL synthesizer, in accordance with an embodiment of the invention.

FIG. 4 is a flow diagram illustrating exemplary steps for calibration of a VCO in the fractional-N PLL synthesizer, in accordance with an embodiment of the invention. Referring to FIG. 4, there is shown a flow diagram 400. In step 404, after start step 402, the en_cal signal may be high to indicate that the open-loop calibration operation is to be performed. In step 406, as part of the open-loop calibration operation, the loop filter 160 may be disconnected from the VCO 166. The D flip-flop 152 may receive the en_cal signal and may generate a control signal to disable the PFD 154 at the next rising edge of the input reference signal 151. With the PFD 154 disabled, the charge pump 156 may discharge the voltage at the output signal 159 which may correspond to the voltage of the loop filter 160. In this regard, the constant leakage current, Ileak, provided by the charge down portion 158b may be utilized to discharge the loop filter voltage. The VCO 166 may be calibrated using a coarse tuning operation that utilizes a plurality of switching capacitors.

In step 408, after the VCO 166 has been coarsely calibrated, the en_cal signal may be low to indicate that the open-loop calibration operation is completed and that the closed-loop settling is to occur. In step 410, as part of the closed-loop settling operation, the loop filter 160 may be connected to the VCO 166. The D flip-flop 152 may receive the en_cal signal and may generate a control signal to enable the PFD 154 at the next rising edge of the input reference signal 151. With the PFD 154 enabled, the charge pump 156 may charge up the voltage at the output signal 159 which may correspond to the voltage of the loop filter 160. In this regard, the up current, Iup, provided by the charge up portion 158a may be utilized to charge the loop filter voltage. The VCO 166 may be calibrated using a fine tuning operation that utilizes a plurality of varactors. After step 410, the process may proceed to end step 412.

Figure 5:
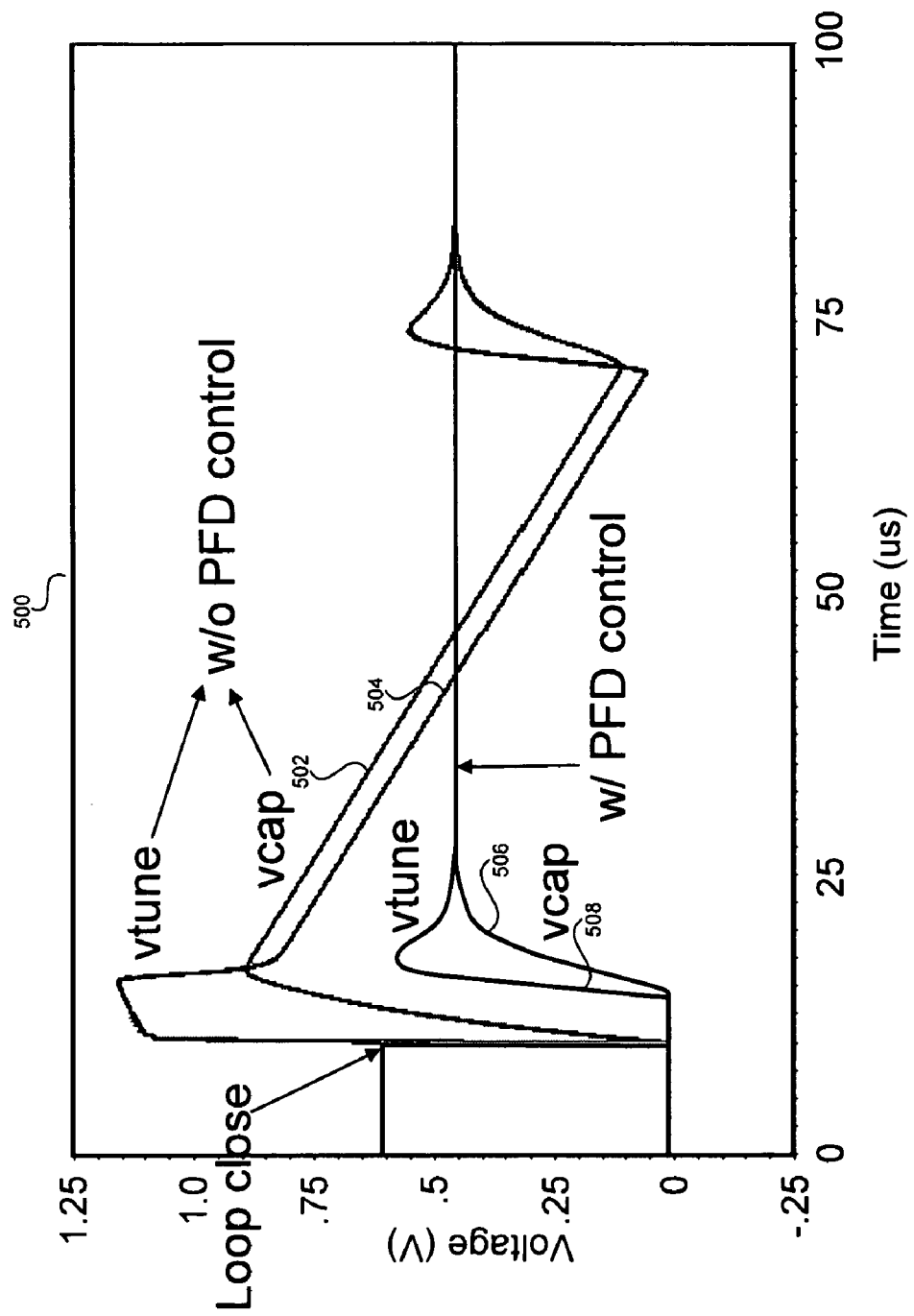
FIG. 5 is a diagram illustrating an exemplary transient response during closed-loop settling with and without PFD control, in accordance with an embodiment of the invention.

FIG. 5 is a diagram illustrating an exemplary transient response during closed-loop settling with and without PFD control, in accordance with an embodiment of the invention. Referring to FIG. 5, there is shown a timing diagram 500 that may correspond to an exemplary embodiment of the fractional-N PLL synthesizer 150 where the total capacitance of the loop filter 160 is 1 nF, the up current, Iup, is 1.2 mA, the leakage current, Ileak, is 24 µA, and the VCO conversion factor, $K_{VCO}$, is 35 MHz/V. In this regard, the signal 502, which may correspond to the voltage over C1 164a, and the signal 504, which may correspond to VCO tuning voltage 165, both correspond to the instance when the D flip-flop 152 and the en_cal signal are not utilized for controlling the PFD 154. In addition, the signal 506, which may correspond to the voltage over C1 164a, and the signal 508, which may correspond to VCO tuning voltage 165, both correspond to the instance when the D flip-flop 152 and the en_cal signal are utilized for controlling the PFD 154. When the D flip-flop 152 and the en_cal signal are utilized, the loop filter voltage at the end of the open-loop calibration operation is approximately ground. Moreover, the timing diagram 500 shows that the use of the D flip-flop 152 and the en_cal signal significantly reduce the close-loop settling time.

The approach and design described above may enable the implementation of a fractional-N PLL frequency synthesizer that may provide reduced power requirements, improved noise performance, and/or higher operating bandwidth to enable the operation of wireless terminals that may support, for example, advanced WLAN system requirements. Moreover, the fractional-N PLL frequency synthesizer described above may also enable a shorter calibration time by reducing the closed-loop settling time that occurs after VCO open-loop calibration.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
in a fractional-N phase-locked-loop (PLL) synthesizer comprising a phase-frequency detector (PFD), a loop filter, and a VCO,
disabling of said PFD via a control signal and discharging said loop filter to ground via an unswitched leakage current, wherein said control signal is generated based on a received signal that indicates enabling an open-loop calibration of said VCO; and
subsequently enabling said PFD via said control signal when said received signal indicates a completion of said open loop calibration of said VCO and said received signal is triggered by an input reference signal thereby causing a phase of said input reference signal to lag a phase of a divider signal generated by a divider in said fractional-N PLL synthesizer.

2. The method according to claim 1, comprising generating said control signal in a D flip-flop in said fractional-N PLL synthesizer.

3. The method according to claim 1, wherein said PFD controls a charge pump in said fractional-N PLL synthesizer via a single control signal.

4. The method according to claim 3, comprising discharging said loop filter in said fractional-N PLL synthesizer via a constant leakage current in said charge pump during said open-loop calibration.

5. The method according to claim 3, comprising charging said loop filter in said fractional-N PLL synthesizer via a charge up portion in said charge pump during said closed-loop settling.

6. The method according to claim 3, wherein said charge pump is programmable.

7. The method according to claim 1, wherein said divider is a multi-modulus divider (MMD).

8. The method according to claim 1, comprising configuring a conversion factor in said VCO.

9. The method according to claim 1, comprising disconnecting said VCO from a loop filter in said fractional-N PLL synthesizer during said open-loop calibration.

10. The method according to claim 1, comprising connecting said VCO to a loop filter in said fractional-N PLL synthesizer during said closed-loop settling.

11. A system for signal processing, the system comprising:
a fractional-N phase-locked-loop (PLL) synthesizer that comprises a phase-frequency detector (PFD), a loop filter, and a VCO;
said fractional-N PLL synthesizer enables the disabling of said PFD via a control signal and discharging said loop filter to ground via an unswitched leakage current, wherein said control signal is generated based on a received signal that indicates enabling an open-loop calibration of said VCO; and
said fractional-N PLL synthesizer subsequently enables the enabling of said PFD via said control signal when said received signal indicates a completion of said open loop calibration of said VCO and said received signal is triggered by an input reference signal thereby causing a phase of said input reference signal to lag a phase of a divider signal generated by a divider in said fractional-N PLL synthesizer.

12. The system according to claim 11, wherein said fractional-N PLL synthesizer comprises a D flip-flop that enables generation of said control signal.

13. The system according to claim 11, wherein said PFD controls a charge pump in said fractional-N PLL synthesizer via a single control signal.

14. The system according to claim 13, wherein said fractional-N PLL synthesizer enables discharging said loop filter in said fractional-N PLL synthesizer via a constant leakage current in said charge pump during said open-loop calibration.

15. The system according to claim 13, wherein said fractional-N PLL synthesizer enables charging said loop filter in said fractional-N PLL synthesizer via a charge up portion in said charge pump during said closed-loop settling.

16. The system according to claim 13, wherein said charge pump is programmable.

17. The system according to claim 15, wherein said divider is a multi-modulus divider (MMD).

18. The system according to claim 11, wherein said fractional-N PLL synthesizer enables configuration of a conversion factor in said VCO.

19. The system according to claim 11, wherein said fractional-N PLL synthesizer enables disconnection of said VCO from a loop filter in said fractional-N PLL synthesizer during said open-loop calibration.

20. The system according to claim 11, wherein said fractional-N PLL synthesizer enables connection of said VCO to a loop filter in said fractional-N PLL synthesizer during said closed-loop settling.

* * * * *